United States Patent
Aytug et al.

(10) Patent No.: US 9,771,656 B2
(45) Date of Patent: Sep. 26, 2017

(54) SUPERHYDROPHOBIC FILMS AND METHODS FOR MAKING SUPERHYDROPHOBIC FILMS

(75) Inventors: Tolga Aytug, Knoxville, TN (US); Mariappan Parans Paranthaman, Knoxville, TN (US); John T. Simpson, Clinton, TN (US); Daniela Florentina Bogorin, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 799 days.

(21) Appl. No.: 13/596,792

(22) Filed: Aug. 28, 2012

(65) Prior Publication Data

US 2014/0065368 A1    Mar. 6, 2014

(51) Int. Cl.
*C23C 14/00* (2006.01)
*C23C 30/00* (2006.01)
(Continued)

(52) U.S. Cl.
CPC .............. *C23C 30/00* (2013.01); *B32B 33/00* (2013.01); *C23C 14/08* (2013.01);
(Continued)

(58) Field of Classification Search
CPC ..... B32B 2307/73; B32B 33/00; C23C 14/08; C23C 30/00; C23C 14/028; C23C 14/18;
(Continued)

(56) References Cited

U.S. PATENT DOCUMENTS 4,428,810 A * 1/1984 Webb ................. C03C 17/245
                                                            136/265
6,562,715 B1 * 5/2003 Chen et al. .................. 438/643
(Continued)

FOREIGN PATENT DOCUMENTS

CN      100540153       9/2009
EP      1844863 A1     10/2007
(Continued)

OTHER PUBLICATIONS

Lai et al., "Recent progress on the superhydrophobic surfaces with special adhesion: From natural to biomimetic to functional", Journal of Nanoengineering and Nanomanufacturing (2011) 1: 18-34.
(Continued)

*Primary Examiner* — Timon Wanga
(74) *Attorney, Agent, or Firm* — Fox Rothschild LLP

(57) ABSTRACT

This disclosure relates to methods that include depositing a first component and a second component to form a film including a plurality of nanostructures, and coating the nanostructures with a hydrophobic layer to render the film superhydrophobic. The first component and the second component can be immiscible and phase-separated during the depositing step. The first component and the second component can be independently selected from the group consisting of a metal oxide, a metal nitride, a metal oxynitride, a metal, and combinations thereof. The films can have a thickness greater than or equal to 5 nm; an average surface roughness (Ra) of from 90 to 120 nm, as measured on a 5 μm×5 μm area; a surface area of at least 20 m²/g; a contact angle with a drop of water of at least 120 degrees; and can maintain the contact angle when exposed to harsh conditions.

31 Claims, 7 Drawing Sheets

(51) Int. Cl.
*B32B 33/00* (2006.01)
*C23C 14/08* (2006.01)

(52) U.S. Cl.
CPC ... *B32B 2307/73* (2013.01); *Y10T 428/24355* (2015.01); *Y10T 428/24364* (2015.01); *Y10T 428/25* (2015.01)

(58) Field of Classification Search
CPC ...... C09D 5/16; C09D 5/1618; C09D 5/1693; G02B 27/006
See application file for complete search history.

(56) References Cited

U.S. PATENT DOCUMENTS

| | | | |
|---|---|---|---|
| 7,758,928 B2 | 7/2010 | Bunce et al. | |
| 7,892,606 B2 | 2/2011 | Thies et al. | |
| 7,914,158 B2 | 3/2011 | Schulz et al. | |
| 7,923,075 B2 | 4/2011 | Yeung et al. | |
| 998,919 A1 | 8/2011 | Rong et al. | |
| 8,017,234 B2 | 9/2011 | Jin et al. | |
| 8,119,314 B1 | 2/2012 | Heuft et al. | |
| 8,119,315 B1 | 2/2012 | Heuft et al. | |
| 8,153,233 B2 | 4/2012 | Sheng et al. | |
| 2006/0175198 A1* | 8/2006 | Vermeersch et al. | 204/298.12 |
| 2006/0216476 A1 | 9/2006 | Ganti et al. | |
| 2007/0215004 A1 | 9/2007 | Kuroda et al. | |
| 2007/0231542 A1 | 10/2007 | Deng et al. | |
| 2007/0298216 A1 | 12/2007 | Jing et al. | |
| 2008/0097143 A1 | 4/2008 | Califorrniaa | |
| 2008/0185343 A1 | 8/2008 | Meyer et al. | |
| 2008/0213853 A1 | 9/2008 | Garcia et al. | |
| 2008/0221263 A1 | 9/2008 | Kanagasabapathy et al. | |
| 2008/0248263 A1* | 10/2008 | Kobrin | 428/195.1 |
| 2008/0248281 A1 | 10/2008 | Nakaguma et al. | |
| 2008/0280699 A1 | 11/2008 | Jarvholm | |
| 2008/0286556 A1 | 11/2008 | D'Urso et al. | |
| 2009/0011222 A1 | 1/2009 | Xiu et al. | |
| 2009/0029145 A1 | 1/2009 | Thies et al. | |
| 2009/0042469 A1 | 2/2009 | Simpson | |
| 2009/0076430 A1 | 3/2009 | Simpson et al. | |
| 2009/0118420 A1 | 5/2009 | Zou et al. | |
| 2009/0253867 A1 | 10/2009 | Takahashi et al. | |
| 2009/0318717 A1 | 12/2009 | Virtanen et al. | |
| 2010/0021692 A1 | 1/2010 | Bormashenko et al. | |
| 2010/0056415 A1 | 3/2010 | Rong et al. | |
| 2010/0068434 A1 | 3/2010 | Steele et al. | |
| 2010/0068509 A1* | 3/2010 | Ma et al. | 428/336 |
| 2010/0090345 A1 | 4/2010 | Sun | |
| 2010/0112204 A1 | 5/2010 | Marte et al. | |
| 2010/0129258 A1 | 5/2010 | Diez Gil et al. | |
| 2010/0130082 A1 | 5/2010 | Lee et al. | |
| 2010/0184913 A1 | 7/2010 | Ebbrecht et al. | |
| 2010/0200512 A1 | 8/2010 | Chase et al. | |
| 2010/0239824 A1 | 9/2010 | Weitz et al. | |
| 2010/0266648 A1 | 10/2010 | Ranade et al. | |
| 2010/0272987 A1 | 10/2010 | Marte et al. | |
| 2010/0291723 A1 | 11/2010 | Low et al. | |
| 2010/0326699 A1 | 12/2010 | Greyling | |
| 2010/0330278 A1 | 12/2010 | Choi et al. | |
| 2011/0008401 A1 | 1/2011 | Ranade et al. | |
| 2011/0041912 A1 | 2/2011 | Ragogna et al. | |
| 2011/0042004 A1 | 2/2011 | Schubert | |
| 2011/0070180 A1 | 3/2011 | Ranade et al. | |
| 2011/0084421 A1 | 4/2011 | Soane et al. | |
| 2011/0095389 A1 | 4/2011 | Cui et al. | |
| 2011/0104021 A1 | 5/2011 | Curello et al. | |
| 2011/0143094 A1 | 6/2011 | Kitada et al. | |
| 2011/0150765 A1 | 6/2011 | Boyden et al. | |
| 2011/0160374 A1 | 6/2011 | Jin et al. | |
| 2011/0177320 A1 | 7/2011 | Mehrabi et al. | |
| 2011/0195181 A1 | 8/2011 | Jin et al. | |
| 2011/0217544 A1 | 9/2011 | Young et al. | |
| 2011/0223415 A1 | 9/2011 | Drescher et al. | |
| 2011/0226738 A1 | 9/2011 | Lee | |
| 2011/0229667 A1 | 9/2011 | Jin et al. | |
| 2011/0232522 A1 | 9/2011 | Das et al. | |
| 2011/0250353 A1 | 10/2011 | Caruso et al. | |
| 2011/0263751 A1 | 10/2011 | Mayer et al. | |
| 2011/0277393 A1 | 11/2011 | Hohmann, Jr. | |
| 2011/0311805 A1* | 12/2011 | Schier | C23C 14/081 428/329 |
| 2012/0028022 A1 | 2/2012 | Brugger et al. | |
| 2012/0028342 A1 | 2/2012 | Ismagilov et al. | |
| 2012/0029090 A1 | 2/2012 | Brugger et al. | |
| 2012/0041221 A1 | 2/2012 | McCarthy et al. | |
| 2012/0058355 A1 | 3/2012 | Lee et al. | |
| 2012/0058697 A1* | 3/2012 | Strickland et al. | 442/59 |
| 2012/0088066 A1 | 4/2012 | Aytug et al. | |
| 2012/0107581 A1* | 5/2012 | Simpson et al. | 428/203 |

FOREIGN PATENT DOCUMENTS

| | | |
|---|---|---|
| EP | 2019120 A1 | 1/2009 |
| EP | 2286991 A1 | 2/2011 |
| EP | 2091492 B1 | 9/2011 |
| JP | 2010510338 | 4/2010 |
| WO | WO 2007092746 A2 | 8/2007 |
| WO | WO 2008063134 A1 | 5/2008 |
| WO | WO 2009029979 A1 | 3/2009 |
| WO | WO 2009118552 A1 | 10/2009 |
| WO | WO 2009125202 A1 | 10/2009 |
| WO | 20090158046 | 12/2009 |
| WO | WO 2009158046 A1 | 12/2009 |
| WO | WO 2010000493 A2 | 1/2010 |
| WO | WO 2010038046 A1 | 4/2010 |
| WO | WO 2010042555 A2 | 4/2010 |
| WO | WO 2010147942 A1 | 12/2010 |
| WO | WO 2011022678 A1 | 2/2011 |
| WO | WO 2011034678 A1 | 3/2011 |
| WO | WO 2011070371 A1 | 6/2011 |
| WO | WO 2011084811 A | 7/2011 |
| WO | WO 2011109302 A2 | 9/2011 |
| WO | WO 2011156095 A2 | 12/2011 |
| WO | WO 2011163556 A2 | 12/2011 |
| WO | WO 2012011142 A1 | 1/2012 |
| WO | WO 2012012441 A1 | 1/2012 |
| WO | WO 2012024005 A2 | 2/2012 |
| WO | WO 2012044522 A1 | 4/2012 |
| WO | WO 2012054039 A1 | 4/2012 |

OTHER PUBLICATIONS

Roach et al., "Progress in superhydrophobic surface development", Soft Matter (2008) 4: 224-240.

"A perspective on conducting oxide buffers for Cu-based YBCO-coated conductors" by Kim et al., Institute of Physics Publishing, Superconductor Science and Technology, Published Feb. 7, 2006, Online at stacks.iop.org/SUST/19/R23.

* cited by examiner

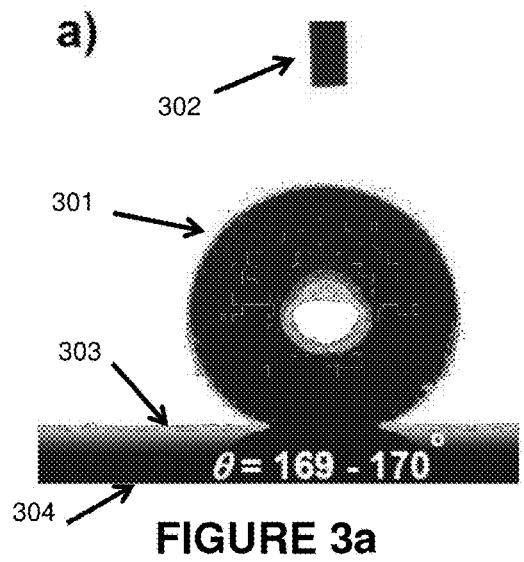
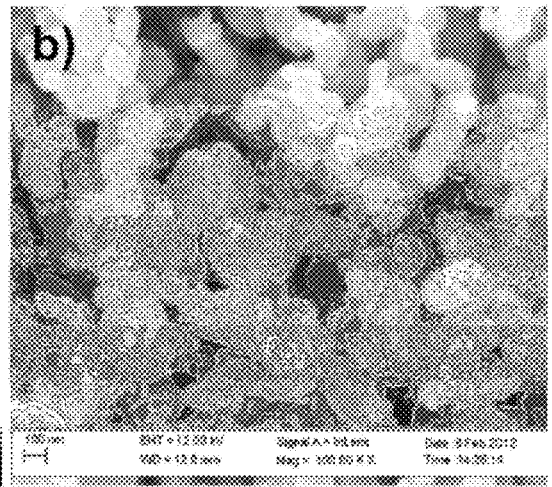
FIGURE 3a
FIGURE 3b
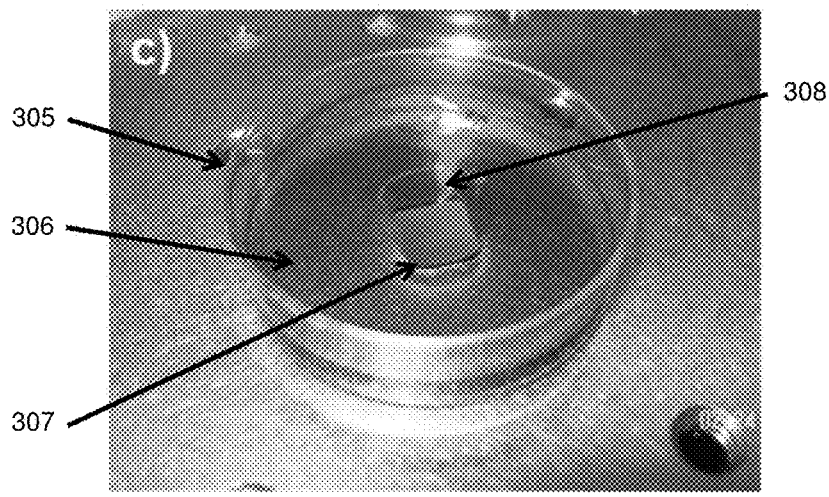
FIGURE 3c

SUPERHYDROPHOBIC FILMS AND METHODS FOR MAKING SUPERHYDROPHOBIC FILMS

STATEMENT REGARDING FEDERALLY SPONSORED RESEARCH OR DEVELOPMENT

The present invention was made in the course of federally sponsored research or development. The United States Government has rights in this invention pursuant to contract no. DE-AC05-00OR22725 between the United States Department of Energy and UT-Battelle, LLC.

BACKGROUND OF THE INVENTION

1. Field of the Invention

The invention relates generally to superhydrophobic films and methods of making superhydrophobic films, and more specifically to superhydrophobic films having structured features formed from immiscible or phase-separated components.

2. Description of the Related Art

Traditional superhydrophobic coatings are soft in nature and have a surface chemistry that results in reduced adhesion and durability. Hence such coatings are often not suitable for robust applications, requiring surface hardness, durability, and adhesion. While there have been reports of superhydrophobic coatings in the literature, these films are mostly based on fabrication via methods of polymer reconformation, sol-gel, spray-on powder coatings, or self-assembly of nano-arrays or nano-structures onto surfaces. The polymer-based films are typically poorly bounded to the substrate, and thus are not sufficiently durable to satisfy most application requirements. Harsh chemical treatment procedures (i.e., use of chemical solvent mixtures) tend to degrade the physical properties of the underlying materials. Moreover, in many cases the toxicity of the different reagents used during the fabrication processes poses risk to human health and environmental concerns, which to date has limited these methods to laboratory research, and are unsuitable for commercial applications. Similarly, powder-based coatings also exhibit weak durability, because it is often necessary to use application-specific binding agents. On the other hand, while sol-gel based coatings have a propensity for better bonding, they generally exhibit poor hydrophobic qualities, i.e., a low water contact angle, due to a lack of nano-scale sharpening and porosity. Coatings based on nanoarrays or nanoparticles possess similar problems as in the case of polymer or sol-gel based films, in addition to exhibiting poor homogeneity. Furthermore, fabrication of these nanostructure assemblies involves elaborate processing schemes that can render them unsuitable for large-scale development and production.

BRIEF SUMMARY OF THE INVENTION

Various embodiments relate to methods of making a superhydrophobic film, which can include depositing a first component and a second component to form a film including a plurality of nanostructures, and coating the nanostructures with a hydrophobic layer to render the film superhydrophobic. The first component and the second component can be immiscible and phase-separated during the depositing step. The first component and the second component can be independently selected from the group consisting of a metal oxide, a metal nitride, a metal oxynitride, a metal, and combinations thereof.

Various embodiments relate to films including a plurality of nanostructures coated with a hydrophobic layer. The films can have a thickness greater than or equal to 5 nm; an average surface roughness (Ra) of from 90 to 120 nm, as measured on a 5 µm×5 µm area; an average surface roughness (Ra) of from 20 to 500 nm, as measured on a 10 µm×10 µm area; a surface area of at least 20 m$^2$/g; a contact angle with a drop of water of at least 120 degrees; and can maintain the contact angle when exposed to a temperature in a range of from −40 degrees Celsius to 800 degrees C. The plurality of nanostructures can include a plurality of disordered structural features, each feature can have a width of less than or equal to 150 nm. The hydrophobic layer can include a fluorocarbon, a methylated compound, a hydrophobic fatty acid and combinations thereof.

BRIEF DESCRIPTION OF THE DRAWINGS

These and other features, aspects, and advantages of the present invention will become better understood with reference to the following description and appended claims, and accompanying drawings where:

FIG. 3(a) is an image showing the profile of a water droplet (~4 µl) on the surface of a superhydrophobic $TiO_2$:$Cu_2O$ composite thin film coating on $SrTiO_3$ substrate, with a static contact angle of 170° and a roll-off angle <0.5°;

FIG. 3(b) shows a plan-view scanning electron microscopy image of the same film shown in FIG. 3(a), displaying nanostructural features (100 nm size) on the surface with a coral-like appearance;

FIG. 3(c) is a photograph showing the same superhydrophobic transparent coating as shown in FIG. 3(a) and FIG. 3(b), demonstrating the "Moses effect", where the water (blue colored) is expelled from the surface;

Figure 1:
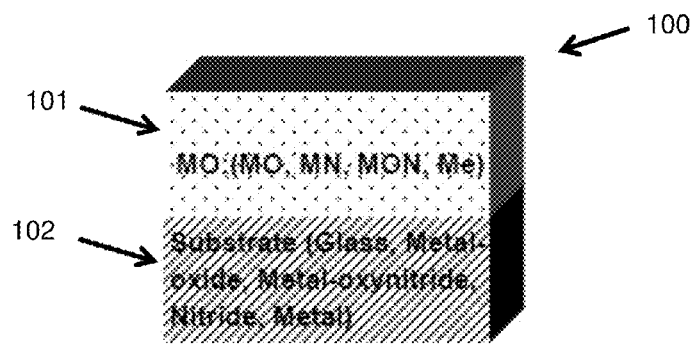
FIG. 1 shows a schematic illustration of a superhydrophobic structure.

It should be understood that the various embodiments are not limited to the arrangements and instrumentality shown in the drawings.

DETAILED DESCRIPTION OF THE INVENTION

The present invention may be understood more readily by reference to the following detailed description of preferred embodiments of the invention as well as to the examples included therein. All numeric values are herein assumed to be modified by the term "about," whether or not explicitly indicated. The term "about" generally refers to a range of numbers that one of skill in the art would consider equivalent to the recited value (i.e., having the same function or result). In many instances, the term "about" may include numbers that are rounded to the nearest significant figure.

A "hydrophobic" surface is generally defined and defined herein as that which has a contact angle of from 90 degrees to 150 degrees with a drop of water. A "super-hydrophobic" surface is generally defined and is defined herein as that which has a contact angle greater than 150 degrees with a drop of water. The maximum possible contact angle that can be achieved between a drop of water and a surface is 180 degrees. Various embodiments utilize phase-separation in oxide materials and create thin film-based coatings with exceptional superhydrophobicity, with contact angles of nearly 180 degrees. These embodiments can overcome not only the above-listed problems, but can also provide very high levels of mechanical, thermal and environmental stability, while relying on easily manufactured formulations that are inherently scalable and cost-effective.

Various embodiments produce a superhydrophobic film by modifying the surface chemistry of nanostructural and/or microstructural features created by depositing immiscible components that phase-separate before, during, or after the deposition. The immiscible components can include at least a first component and a second component. The first component and the second component can be independently selected from the group consisting of a metal oxide, a metal nitride, a metal oxynitride, a metal, and combinations thereof. For example, various preferred embodiments produce such nanostructured films from two or more thermodynamically stable oxide materials that exhibit a degree of insolubility. The degree of insolubility can range from partial insolubility to complete insolubility. The insolubility of the materials drives a phase separation combined with minimization of elastic strain (i.e., lattice misfit strain) governing the nanostructural transformation.

The first component and the second component can have a degree of insolubility with each other within a range having a lower limit and/or an upper limit. The range can include or exclude the lower limit and/or the upper limit. The lower limit and/or upper limit can be selected from 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 95.1, 95.2, 95.3, 95.4, 95.5, 95.6, 95.7, 95.8, 95.9, 96, 96.1, 96.2, 96.3, 96.4, 96.5, 96.6, 96.7, 96.8, 96.9, 97, 97.1, 97.2, 97.3, 97.4, 97.5, 97.6, 97.7, 97.8, 97.9, 98, 98.1, 98.2, 98.3, 98.4, 98.5, 98.6, 98.7, 98.8, 98.9, 99, 99.1, 99.2, 99.3, 99.4, 99.5, 99.6, 99.7, 99.8, 99.9, and 100%. For example, according to certain preferred embodiments, the first component and the second component can have a degree of insolubility with each other from 5% to 95% insoluble.

In general, the detailed film nanostructure is dependent on and arises from the combination of crystalline epitaxy with a substrate, film growth parameters during vapor phase deposition, and complete phase insolubility of the component oxides. Phase separation can be realized in at least two ways: (1) by using the appropriate thermodynamic conditions (i.e., temperature and oxygen pressure) during the deposition or (2) by post-annealing the deposited composite film at those appropriate conditions.

The modification of the surface chemistry generally occurs after the deposition of the immiscible components. A goal of modifying the surface chemistry of these features is to provide a low-surface-energy. Therefore, the surface chemistry can be modified in various ways, for example, by applying a hydrophobic coating. It is advantageous if the hydrophobic coating is sufficiently thin to avoid smoothing over or otherwise destroying the surface topology created by the nanostructural and/or microstructural features. The combination of nanostructural and/or microstructural features and a low-surface-energy is useful to provide an exceptional level of superhydrophobicity.

The application has a variety of commercial applications. For example, the films can be employed as optical coatings, such as for windows, scopes, lens cover slips, neutral density filters, and optical films for photovoltaic surfaces. The films can also be employed as durable water repellant coatings. Such coatings can be used to coat high value metals and products. The films can be employed in sensors that exposed to weather conditions to keep the sensors dry and prevent corrosion. The films can be employed in separation equipment. Separation equipment can include but is not limited to: filters, membranes, hydrocarbon based liquid separation equipment, oil/water separation equipment, and artificial gills. The films can be employed as coatings generally and as self-cleaning surfaces, anti-biofouling surfaces, anti-corrosion surfaces, anti-icing coatings, electric insulation coatings, thermal insulation coatings, and anti-icing coatings. The films can be employed in superhydrophobic pattern printing.

The films can be used in addition to or as a substitute for superhydrophobic (SH) spinodal glass coatings, as described in US Patent Publication US 2012/0088066, which is hereby incorporated by reference in its entirety, especially in applications such as self-cleaning surfaces, anti-fouling surfaces and anti-corrosion surfaces.

The films can be used in addition to or as a substitute for superhydrophobic (SH) powder based coatings, as described in US Patent Publication US 2008/0286556, which is hereby incorporated by reference in its entirety, especially in applications such as coatings for watercraft hulls, construction, and liners for pipes and conduits and for the fabrication of membranes for gas separation.

The films can also be used in addition to or as a substitute for superhydrophobic diatomaceous earth (SHDE) and/or in addition to or as a substitute for superhydrophobic (SH) polymers.

Various embodiments provide highly durable and reliable coatings since the developed films can be atomically bonded to an underlying substrate template and are composed of inorganic materials that are chemically stable, thermodynamically stable, and environmentally stable, providing significant advantages over the competing technologies. As used herein, the term "atomically bonded" means any type of bonding, including metallic bonds, ionic bonds, and covalent bonds.

Moreover, because the processes according to various embodiments are not complex, use inexpensive base materials, and are scalable, they offer a practical and cost effective route to creation of commercially viable new-class of leading edge superhydrophobic products.

It is also advantageous that the component materials used according to various embodiments are non-toxic, highly developed, abundant and inexpensive. The non-toxic nature of these materials also simplifies the overall fabrication process and waste material disposal requirements that are typically inherent for other technologies.

The films produced according to various embodiments can be optically transparent. As used herein, "optically transparent" refers to a material or layer that transmits rays of visible light in such a way that the human eye may see through the glass distinctly. One definition of optically transparent is a maximum of 50% attenuation at a wavelength of 550 nm (green light) for a material or layer, e.g., a layer 1 µm thick. Another definition can be based on the Strehl Ratio, which ranges from 0 to 1, with 1 being a perfectly transparent material. Exemplary optically transparent materials can have a Strehl Ratio ≥0.5, or a Strehl Ratio ≥0.6, or a Strehl Ratio ≥0.7, or a Strehl Ratio ≥0.8, or a Strehl Ratio ≥0.9, or a Strehl Ratio ≥0.95, or a Strehl Ratio ≥0.975, or a Strehl Ratio ≥0.99.

According to various embodiments, the dimensions of the nanostructured surface features are sufficiently small to provide optical transparency to the article, such as dimensions of <200 nm so that the dimensions are less than the wavelength of the light, such as dimensions of 50 to 100 nm, or less. Smaller feature sizes (<200 nm) make the surface more optically transparent.

Method Embodiment

Various embodiments relate to methods of making a superhydrophobic film, which can include depositing a first component and a second component to form a film including a plurality of nanostructures, and coating the nanostructures with a hydrophobic layer to render the film superhydrophobic.

First and Second Components

The first component and the second component can be immiscible and phase-separated during the depositing step. The first component and the second component can be independently selected from the group consisting of a metal oxide, a metal nitride, a metal oxynitride, a metal, and combinations thereof.

As stated above, the first component and the second component can be independently selected from a group including a metal oxide. The metal oxide can be selected from the group consisting of $SiO_2$, $Cu_xO_y$, ZnO, MgO, $SnO_2$, $Ti_xO_y$, $(RE)MnO_3$, $Bi_2O_3$, $ZnMn_2O_4$, $Fe_2O_3$, $WO_3$, $Al_2O_3$, $Ba_xNb_yO_z$, $Ba_xTa_yO_z$, $Ba_xSn_yO_z$, $Ba_xAl_yO_z$, $CoFeO_3$, $CoTiO_3$, $BiFeO_3$, $BaTiO_3$, $(RE)_xTa_yO_z$, $(RE)_xNb_yO_z$, $(RE)AlO_3$, $(RE)_2BaTaO_6$, $(RE)_2BaNbO_6$ and combinations thereof. The integers x, y, and z can be selected independently of each other and can be within a range having a lower limit and/or an upper limit. The range can include or exclude the lower limit and/or the upper limit. The lower limit and/or upper limit can be selected from 1, 2, 3, 4, 5, 6, and 7. For example, according to certain preferred embodiments, the integer x, the integer y, and/or the integer z can be from 1 to 7. The term "(RE)" represents a rare earth element selected from the group consisting of Sc, Y, La, Ce, Pr, Nd, Pm, Sm, Eu, Gd, Tb, Dy, Ho, Er, Tm, Yb, and Lu.

As stated above, the first component and the second component can be independently selected from a group including a metal nitride. The metal nitride can be selected from the group consisting of TiN, ZrN, YN, VN, WN, GaN, AlN, HfN, TaN, NbN, InN, $Si_3N_4$, GaN, $Zn_3N_2$, and combinations thereof.

As stated above, the first component and the second component can be independently selected from a group including a metal oxynitride. The metal oxynitride can be selected from the group consisting of $TiO_xN_y$, $ZrO_xN_y$, $HfO_xN_y$, $VO_xN_y$, $TaO_xN_y$, $NbO_xN_y$, $SiO_xN_y$, and combinations thereof. The integers x and y can be selected independently of each other and can be within a range having a lower limit and/or an upper limit. The range can include or exclude the lower limit and/or the upper limit. The lower limit and/or upper limit can be selected from 0, 1, 2, 3, and 4. For example, according to certain preferred embodiments, the integer x and/or the integer y can be from 0 to 4.

As stated above, the first component and the second component can be independently selected from a group including a metal. The metal can be selected from the group consisting of Pd, Ta, Zr, Ti, Ir, Hf, Pt, Au, Ni, Zn, Mg, Cu, Al, and combinations thereof.

According to certain embodiments, the first component can be TixOy and the second component can be $Cu_xO_y$. The integers x and y can be selected independently of each other and can be within a range having a lower limit and/or an upper limit. The range can include or exclude the lower limit and/or the upper limit. The lower limit and/or the upper limit can be selected from 1, 2, 3, 4, 5, 6, 7, 8, 9, and 10. For example, according to certain preferred embodiments, the integer x and/or the integer y can be from 1 to 10. According to one preferred embodiment, the first component can be $TiO_2$ and the second component can be $Cu_2O$.

Substrate

According to various embodiments, the first component and the second component can be deposited onto a substrate, and the film can be formed on the substrate.

The substrate can include an amorphous material. The amorphous material can be selected from the group consisting of a glass, a polymer, and combinations thereof. The amorphous material can be fluoropolymer. For example, the amorphous material can include polytetrafluoroethylene (PTFE).

The substrate can include a crystalline material. The crystalline material can be selected from the group consisting of Si, Ge, GaAs, InP, GaN, $SrTiO_3$, $LaAlO_3$, Yttria stabilized zirconia (YSZ), MgO, Sapphire ($Al_2O_3$), biaxially textured Nickel, Copper, Silver, Nickel alloys, Copper alloys, Silver alloys and combinations thereof.

The substrate can include a polycrystalline material. The polycrystalline material can be selected from the group consisting of a metal, an oxide, an oxynitride, and combinations thereof. The polycrystalline material can be selected from the group consisting of a metal oxide, a metal nitride, a metal oxynitride, a metal, and combinations thereof.

As described above, the substrate can include a polycrystalline material and the polycrystalline material can be selected from the group including a metal oxide. The metal oxide can be selected from the group consisting of $Cu_xO_y$, ZnO, MgO, $SnO_2$, $Ti_xO_y$, $(RE)MnO_3$, $Bi_2O_3$, $ZnMn_2O_4$, $Fe_2O_3$, $WO_3$, $Al_2O_3$, $Ba_xNb_yO_z$, $Ba_xTa_yO_z$, $Ba_xSn_yO_z$, $Ba_xAl_yO_z$, $CoFeO_3$, $CoTiO_3$, $BiFeO_3$, $BaTiO_3$, $(RE)_xTa_yO_z$, $(RE)_xNb_yO_z$, $(RE)AlO_3$, $(RE)_2BaTaO_6$, $(RE)_2BaNbO_6$ and combinations thereof. The integers x, y, and z can be selected independently of each other and can be within a range having a lower limit and/or an upper limit. The range can include or exclude the lower limit and/or the upper limit. The lower limit and/or upper limit can be selected from 1, 2, 3, 4, 5, 6, and 7. For example, according to certain preferred embodiments, the integer x, the integer y, and/or the integer z can be from 1 to 7. The term "(RE)" represents a rare earth element selected from the group consisting of Sc, Y, La, Ce, Pr, Nd, Pm, Sm, Eu, Gd, Tb, Dy, Ho, Er, Tm, Yb, and Lu.

As described above, the substrate can include a polycrystalline material and the polycrystalline material can be selected from the group including a metal nitride. The metal nitride can be selected from the group consisting of TiN, ZrN, YN, VN, WN, GaN, AlN, HfN, TaN, NbN, InN, $Si_3N_4$, GaN, $Zn_3N_2$, and combinations thereof.

As described above, the substrate can include a polycrystalline material and the polycrystalline material can be selected from the group including a metal oxynitride. The metal oxynitride can be selected from the group consisting of $TiO_xN_y$, $ZrO_xN_y$, $HfO_xN_y$, $VO_xN_y$, $TaO_xN_y$, $NbO_xN_y$, $SiO_xN_y$, and combinations thereof. The integers x and y can be selected independently of each other and can be within a range having a lower limit and/or an upper limit. The range can include or exclude the lower limit and/or the upper limit. The lower limit and/or upper limit can be selected from 0, 1, 2, 3, and 4. For example, according to certain preferred embodiments, the integer x and/or the integer y can be from 0 to 4.

As described above, the substrate can include a polycrystalline material and the polycrystalline material can be selected from the group including a metal. The metal can be selected from the group consisting of Pd, Ta, Zr, Ti, Ir, Hf, Pt, Au, Ni, Zn, Mg, Cu, Al, and combinations thereof. The metal can be selected from the group consisting of a Ni-alloy, Cu-alloy, Ag-alloy, and combinations thereof. The metal can be a HASTELLOY™. HASTELLOY™ is the registered trademark name of Haynes International, Inc. The trademark is applied as the prefix name of a range of twenty two different highly corrosion-resistant metal alloys loosely grouped by the metallurgical industry under the material term "superalloys" or "high-performance alloys". The predominant alloying ingredient is typically the transition metal nickel. Other alloying ingredients are added to nickel in each of the subcategories of this trademark designation and include varying percentages of the elements molybdenum, chromium, cobalt, iron, copper, manganese, titanium, zirconium, aluminum, carbon, and tungsten. The metal can also be a Ni-alloy including at least one selected from the group consisting of Co, Cr, Mo, W, Fe, Si, Mn, C, Ni, and combinations thereof.

The film can be an epitaxial film. The epitaxial film can include a plurality of grains, each grain can include one selected from the first component and the second component.

According to certain embodiments, a percentage of the plurality of grains can have at least one crystalline orientation selected from the group (1,1,1), (1,0,1), (1,0,0), (0,1,0), and (0,0,1). The percentage of the plurality of grains having at least one crystalline orientation selected from the group (1,1,1), (1,0,1), (1,0,0), (0,1,0), and (0,0,1) can be within a range having a lower limit and/or an upper limit. The range can include or exclude the lower limit and/or the upper limit. The lower limit and/or upper limit can be selected from 40, 45, 50, 55, 60, 65, 70, 75, 80, 85, 90, 95, and 100%. For example, according to certain preferred embodiments, the percentage of the plurality of grains having at least one crystalline orientation selected from the group (1,1,1), (1,0,1), (1,0,0), (0,1,0), and (0,0,1) can be at least 50%.

The grains can have a tilt angle within a range having a lower limit and/or an upper limit. The range can include or exclude the lower limit and/or the upper limit. The lower limit and/or upper limit can be selected from 0.25, 0.5, 0.75, 1, 1.25, 1.5, 1.75, 2, 2.25, 2.5, 2.75, 3, 3.25, 3.5, 3.75, 4, 4.25, 4.5, 4.75, 5, 5.25, 5.5, 5.75, 6, 6.25, 6.5, 6.75, 7, 7.25, 7.5, 7.75, 8, 8.25, 8.5, 8.75, 9, 9.25, 9.5, 9.75, 10, 10.25, 10.5, 10.75, 11, 11.25, 11.5, 11.75, 12, 12.25, 12.5, 12.75, 13, 13.25, 13.5, 13.75, 14, 14.25, 14.5, 14.75, 15, 15.25, 15.5, 15.75, and 16 degrees. For example, according to certain preferred embodiments, the grains can have a tilt angle of from 0.5 to 15 degrees.

Hydrophobic Layers

As described above, various embodiments relate to a method of making a superhydrophobic film, which can include depositing a first component and a second component to form a film including a plurality of nanostructures, and coating the nanostructures with a hydrophobic layer to render the film superhydrophobic. The hydrophobic layer can include at least one selected from the group consisting of a fluorocarbon, a perfluorocarbon, a polyfluorocarbon, an aliphatic compound, a methylated compound, and combinations thereof. Any hydrophobic coatings can be used in conjunction with these structures to dramatically increase the effective (macro) hydrophobicity of the coating.

The hydrophobic layer can include a hydrophobic self-assembled monolayer (SAM). As used herein, the term "Self-assembled monolayer" refers to a coating consisting of a single layer of molecules on a surface. In a SAM, the molecules are arranged in a manner where a head group is directed toward or adhered to the surface, generally by the formation of at least one covalent bond, and a tail group is directed to the air interface to provide desired surface properties, such as hydrophobicity. As the hydrophobic tail group has the lower surface energy it dominates the air-surface interface providing a continuous surface of the tail groups.

SAMs useful in the instant invention can be prepared by adding a melt or solution of the desired SAM precursor onto the nanostructured layer where a sufficient concentration of SAM precursor is present to produce a continuous conformal monolayer coating. After the hydrophobic SAM is formed and fixed to the surface of the nanostructured layer 14, any excess precursor can be removed as a volatile or by washing. In this manner the SAM-air interface can be primarily or exclusively dominated by the hydrophobic moiety.

One example of a SAM precursor that can be useful for the compositions and methods described herein is tridecafluoro-1,1,2,2-tetrahydroctyltriclorosilane. In some instances, this molecule undergoes condensation with the silanol groups of the nanostructured layer, which releases HCl and covalently bonds the tridecafluoro-1,1,2,2-tetrahydroctylsilyls group to the silanols at the surface of the porous particle. The tridecafluorohexyl moiety of the tridecafluoro-1,1,2,2-tetrahydroctylsilyl groups attached to the surface of the nanostructured layer provides a monomolecular layer that has a hydrophobicity similar to polytetrafluoroethylene. Thus, such SAMs make it possible to produce a nanostructured layer 14 having hydrophobic surfaces while retaining the desired nanostructured morphology that produces the desired superhydrophobic properties.

A non-exclusive list of exemplary SAM precursors that can be used for various embodiments of the invention is:

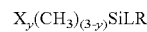

where y=1 to 3; X is Cl, Br, I, H, HO, R'HN, R'$_2$N, imidizolo, R'C(O)N(H), R'C(O)N(R"), R'O, $F_3$CC(O)N(H), $F_3$CC(O)N($CH_3$), or $F_3$S(O)$_2$O, where R' is a straight or branched chain hydrocarbon of 1 to 4 carbons and R" is methyl or ethyl; L, a linking group, is $CH_2CH_2$, $CH_2CH_2CH_2$, $CH_2CH_2O$, $CH_2CH_2CH_2O$, $CH_2CH_2C(O)$, $CH_2CH_2CH_2C(O)$, $CH_2CH_2OCH_2$, $CH_2CH_2CH_2OCH_2$; and R is $(CF_2)_nCF_3$ or $(CF(CF_3)OCF_2)_nCF_2CF_3$, where n is 0 to 24. Preferred SAM precursors have y=3 and are commonly referred to as silane coupling agents. These SAM precursors can attach to multiple OH groups on the surface and can link together with the consumption of water, either residual on the surface, formed by condensation with the surface, or added before, during or after the deposition of the SAM precursor. All SAM precursors yield a most thermodynamically stable structure where the hydrophobic moiety of the molecule is extended from the surface and establish normal conformational populations which permit the hydrophobic moiety of the SAM to dominate the air interface. In general, the hydrophobicity of the SAM surface increases with the value of n for the hydrophobic moiety, although in most cases sufficiently high hydrophobic properties are achieved when n is about 4 or greater where the SAM air interface is dominated by the hydrophobic moiety. The precursor can be a single molecule or a mixture of molecules with different values of n for the perfluorinated moiety. When the precursor is a mixture of molecules it is preferable that the molecular weight distribution is narrow, typically a Poisson distribution or a more narrow distribution.

The SAM precursor can have a non-fluorinated hydrophobic moiety as long as the SAM precursor readily conforms to the nanostructured features of the nanostructured layer and exhibits a sufficiently low surface energy to exhibit the desired hydrophobic properties. Although fluorinated SAM precursors may be preferred, in some embodiments of the invention silicones and hydrocarbon equivalents for the R groups of the fluorinated SAM precursors above can be used. Additional details regarding SAM precursors and methodologies can be found in the patent applications that have been incorporated herein by reference.

The hydrophobic layer can include a hydrophobic fatty acid. The hydrophobic layer can include a hydrophobic fatty acid selected from the group consisting of propanoic acid, butanoic acid, pentanoic acid, hexanoic acid, heptanoic acid, octanoic acid, nonanoic acid, decanoic acid, undecanoic acid, dodecanoic acid, tridecanoic acid, tridecanoic acid, tetradecanoic acid, pentadecanoic acid, hexadecanoic acid, heptadecanoic acid, octadecanoic acid, nonadecanoic acid, eicosanoic acid, heneicosanoic acid, docosanoic acid, tricosanoic acid, tetracosanoic acid, pentacosanoic acid, hexacosanoic acid, heptacosanoic acid, octacosanoic acid, nonacosanoic acid, triacontanoic acid, henatriacontanoic acid, dotriacontanoic acid, tritriacontanoic acid, tetratriacontanoic acid, pentatriacontanoic acid, hexatriacontanoic acid, and combinations thereof.

Table 1 provides a list of some suitable saturated fatty acids with additional details for each.

TABLE 1

| Common Name | Systematic Name | Structural Formula | Lipid Numbers |
| --- | --- | --- | --- |
| Propionic acid | Propanoic acid | $CH_3CH_2COOH$ | C3:0 |
| Butyric acid | Butanoic acid | $CH_3(CH_2)_2COOH$ | C4:0 |
| Valeric acid | Pentanoic acid | $CH_3(CH_2)_3COOH$ | C5:0 |
| Caproic acid | Hexanoic acid | $CH_3(CH_2)_4COOH$ | C6:0 |
| Enanthic acid | Heptanoic acid | $CH_3(CH_2)_5COOH$ | C7:0 |
| Caprylic acid | Octanoic acid | $CH_3(CH_2)_6COOH$ | C8:0 |
| Pelargonic acid | Nonanoic acid | $CH_3(CH_2)_7COOH$ | C9:0 |
| Capric acid | Decanoic acid | $CH_3(CH_2)_8COOH$ | C10:0 |
| Undecylic acid | Undecanoic acid | $CH_3(CH_2)_9COOH$ | C11:0 |
| Lauric acid | Dodecanoic acid | $CH_3(CH_2)_{10}COOH$ | C12:0 |
| Tridecylic acid | Tridecanoic acid | $CH_3(CH_2)_{11}COOH$ | C13:0 |
| Myristic acid | Tetradecanoic acid | $CH_3(CH_2)_{12}COOH$ | C14:0 |

TABLE 1-continued

| Common Name | Systematic Name | Structural Formula | Lipid Numbers |
| --- | --- | --- | --- |
| Pentadecylic acid | Pentadecanoic acid | $CH_3(CH_2)_{13}COOH$ | C15:0 |
| Palmitic acid | Hexadecanoic acid | $CH_3(CH_2)_{14}COOH$ | C16:0 |
| Margaric acid | Heptadecanoic acid | $CH_3(CH_2)_{15}COOH$ | C17:0 |
| Stearic acid | Octadecanoic acid | $CH_3(CH_2)_{16}COOH$ | C18:0 |
| Nonadecylic acid | Nonadecanoic acid | $CH_3(CH_2)_{17}COOH$ | C19:0 |
| Arachidic acid | Eicosanoic acid | $CH_3(CH_2)_{18}COOH$ | C20:0 |
| Heneicosylic acid | Heneicosanoic acid | $CH_3(CH_2)_{19}COOH$ | C21:0 |
| Behenic acid | Docosanoic acid | $CH_3(CH_2)_{20}COOH$ | C22:0 |
| Tricosylic acid | Tricosanoic acid | $CH_3(CH_2)_{21}COOH$ | C23:0 |
| Lignoceric acid | Tetracosanoic acid | $CH_3(CH_2)_{22}COOH$ | C24:0 |
| Pentacosylic acid | Pentacosanoic acid | $CH_3(CH_2)_{23}COOH$ | C25:0 |
| Cerotic acid | Hexacosanoic acid | $CH_3(CH_2)_{24}COOH$ | C26:0 |
| Heptacosylic acid | Heptacosanoic acid | $CH_3(CH_2)_{25}COOH$ | C27:0 |
| Montanic acid | Octacosanoic acid | $CH_3(CH_2)_{26}COOH$ | C28:0 |
| Nonacosylic acid | Nonacosanoic acid | $CH_3(CH_2)_{27}COOH$ | C29:0 |
| Melissic acid | Triacontanoic acid | $CH_3(CH_2)_{28}COOH$ | C30:0 |
| Henatriacontylic acid | Henatriacontanoic acid | $CH_3(CH_2)_{29}COOH$ | C31:0 |
| Lacceroic acid | Dotriacontanoic acid | $CH_3(CH_2)_{30}COOH$ | C32:0 |
| Psyllic acid | Tritriacontanoic acid | $CH_3(CH_2)_{31}COOH$ | C33:0 |
| Geddic acid | Tetratriacontanoic acid | $CH_3(CH_2)_{32}COOH$ | C34:0 |
| Ceroplastic acid | Pentatriacontanoic acid | $CH_3(CH_2)_{33}COOH$ | C35:0 |
| Hexatriacontylic acid | Hexatriacontanoic acid | $CH_3(CH_2)_{34}COOH$ | C36:0 |

Film Properties

As described above, various embodiments relate to a method of making a film. Various properties can be helpful to describe the nature of the film, including but not limited to the thickness of the film, the average surface roughness (Ra) of the film, the surface area of the film, a contact angle between the film and a drop of water, a roll off angle of a drop of water deposited on the film, and a degree of hydrophobicity degradation of the film.

The film can have a thickness within a range having a lower limit and/or an upper limit. The range can include or exclude the lower limit and/or the upper limit. The lower limit and/or upper limit can be selected from 1, 2, 3, 4, 5, 6, 7, 8, 9, 10, 15, 20, 25, 30, 35, 40, 45, 50, 55, 60, 65, 70, 75, 80, 85, 90, 95, 100, 200, 300, 400, 500, 600, 700, 800, 900, 1000, 1100, 1200, 1300, 1400, and 1500 nm. For example, according to certain preferred embodiments, the film can have a thickness greater than or equal to 5 nm, from 5 to 1,000 nm, or from 25 to 50 nm.

The film can have an average surface roughness (Ra), as measured on a 5 µm×5 µm area, within a range having a lower limit and/or an upper limit. The range can include or exclude the lower limit and/or the upper limit. The lower limit and/or upper limit can be selected from 50, 55, 60, 65, 70, 75, 80, 85, 90, 95, 100, 105, 110, 115, 120, 125, 130, 135, 140, 145, 150, 155, 160, 165, 170, 175, 180, 185, 190, 195, 200, 205, 210, 215, 220, 225, 230, 235, 240, 245, and 250 nm. For example, according to certain preferred embodiments, the film can have an average surface roughness (Ra) of from 90 to 120 nm, or of about 104, nm, as measured on a 5 µm×5 µm area.

The film can have an average surface roughness (Ra), as measured on a 10 µm×10 µm area, within a range having a lower limit and/or an upper limit. The range can include or exclude the lower limit and/or the upper limit. The lower limit and/or upper limit can be selected from 5, 10, 15, 20, 25, 50, 75, 100, 125, 150, 175, 200, 225, 250, 275, 300, 325, 350, 375, 400, 425, 450, 475, 500, 600, 700, 800, 900, and 1000 nm. For example, according to certain preferred embodiments, the film can have an average surface roughness (Ra) of from 20 to 500 nm, as measured on a 10 μm×10 μm area.

The film can have a surface area within a range having a lower limit and/or an upper limit. The range can include or exclude the lower limit and/or the upper limit. The lower limit and/or upper limit can be selected from 5, 10, 15, 20, 25, 30, 35, 40, 45, 50, 55, 60, 65, 70, 75, 80, 85, 90, 95, 100, 110, 120, 130, 140, 150, 160, 170, 180, 190, 200, 225, 250, 275, 300, 325, 350, 375, and 400 m²/g. For example, according to certain preferred embodiments, the film can have a surface area of at least 20 m²/g of film, of at least 30 m²/g of film, of at least 50 m²/g of film, or of from 20 to 300 m²/g of film.

When exposed to a temperature, within a range to be defined below, the film can maintain a contact angle within a range having a lower limit and/or an upper limit. The range can include or exclude the lower limit and/or the upper limit. The lower limit and/or upper limit can be selected from 120, 125, 130, 135, 140, 145, 150, 151, 152, 153, 154, 155, 156, 157, 158, 159, 160, 161, 162, 163, 164, 165, 166, 167, 168, 169, 170, 171, 172, 173, 174, 175, 176, 177, 178, and 179 degrees. The above-mentioned temperature can be within a range having a lower limit and/or an upper limit. The range can include or exclude the lower limit and/or the upper limit. The lower limit and/or upper limit can be selected from −100, −90, −80, −70, −60, −50, −40, −30, −20, −10, 0, 10, 20, 30, 40, 50, 60, 70, 80, 90, 100, 150, 200, 250, 300, 350, 400, 450, 500, 550, 600, 650, 700, 750, 800, 850, 900, 950, and 1000 degrees Celsius. For example, according to certain preferred embodiments, the temperature in a range of from −40 degrees Celsius to 800 degrees Celsius. For example, according to certain preferred embodiments, the film can maintain a contact angle of at least 150 degrees with a drop of water when exposed to a temperature in a range of from −40 degrees Celsius to 800 degrees C.

When exposed to ultraviolet radiation having a wavelength, within a range to be defined below, the film can have a degree of hydrophobicity degradation within a range having a lower limit and/or an upper limit. The range can include or exclude the lower limit and/or the upper limit. The lower limit and/or upper limit can be selected from an undetectable limit, 0, 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, and 5%. For example, according to certain preferred embodiments, when exposed to ultraviolet radiation having a wavelength, within a range to be defined below, the film can have no detectable hydrophobicity degradation. The above-mentioned ultraviolet radiation can have a wavelength within a range having a lower limit and/or an upper limit. The range can include or exclude the lower limit and/or the upper limit. The lower limit and/or upper limit can be selected from 25, 50, 75, 100, 125, 150, 175, 200, 225, 250, 275, 300, 325, 350, 375, 400, 425, 450, 475, and 500 nm. For example, according to certain preferred embodiments, the film can have no detectable hydrophobicity degradation, or less than 0.1% hydrophobicity degradation when exposed to ultraviolet radiation having a wavelength of from 100 to 400 nm. As used herein, the term "hydrophobicity degradation" means a lessening in a contact angle between the film and a drop of water disposed upon the film.

The film can have a contact angle with a drop of water within a range having a lower limit and/or an upper limit. The range can include or exclude the lower limit and/or the upper limit. The lower limit and/or upper limit can be selected from 100, 105, 110, 115, 120, 125, 130, 135, 140, 145, 150, 155, 160, 165, 170, 171, 172, 173, 174, 175, 176, 177, 178, and 179 degrees. For example, according to certain preferred embodiments, the film can have a contact angle with a drop of water of at least 120 degrees, of about 175 degrees, or of at least 170 degrees.

The film can have a roll off angle within a range having a lower limit and/or an upper limit. The range can include or exclude the lower limit and/or the upper limit. The lower limit and/or upper limit can be selected from 0.1, 0.2, 0.3, 0.4, 0.5, 0.6, 0.7, 0.8, 0.9, 1, 2, 3, 4, 5, 10, 15, 20, 25, 30, 35, 40, 45, and 50 degrees. For example, according to certain preferred embodiments, the film can have a roll off angle of less than 30 degrees, or of about 0.5 degrees.

Properties of the Nanostructures

The one or more of the plurality of nanostructures can include a plurality of disordered structural features. At least one of the structural features can be selected from the group consisting of an irregular feature, a circular feature, a rectangular feature, a hexagonal feature, a polyhedral feature, and combinations thereof. As used herein, a nanostructure or a nanostructured feature has its literal meaning and includes, but is not limited to, nanoscale protrusions and nanoscale branched networks.

Each of the one or more of the plurality of nanostructures can have a width within a range having a lower limit and/or an upper limit. The range can include or exclude the lower limit and/or the upper limit. The lower limit and/or upper limit can be selected from 1, 2, 3, 4, 5, 6, 7, 8, 9, 10, 15, 20, 25, 30, 35, 40, 45, 50, 55, 60, 65, 70, 75, 80, 85, 90, 95, 100, 105, 110, 115, 120, 125, 130, 135, 140, 145, 150, 155, 160, 165, 170, 175, 180, 185, 190, 195 and 200 nm. For example, according to certain preferred embodiments, the one or more of the plurality of nanostructures can have a width of less than or equal to 150 nm, of less than 100 nm, or of from 5 to 10 nm. According to certain embodiments, the width of each of the plurality of nanostructures is selected independently of the width of other nanostructures in the plurality of nanostructures, such that the plurality of nanostructures comprises a distribution of widths. The distribution of widths can be random or ordered.

Each of the one or more of the plurality of nanostructures can have a length within a range having a lower limit and/or an upper limit. The range can include or exclude the lower limit and/or the upper limit. The lower limit and/or upper limit can be selected from 1, 2, 3, 4, 5, 6, 7, 8, 9, 10, 15, 20, 25, 30, 35, 40, 45, 50, 55, 60, 65, 70, 75, 80, 85, 90, 95, 100, 105, 110, 115, 120, 125, 130, 135, 140, 145, 150, 155, 160, 165, 170, 175, 180, 185, 190, 195 and 200 nm. For example, according to certain preferred embodiments, the one or more of the plurality of nanostructures can have a length of less than or equal to 150 nm, of less than 100 nm, or of from 5 to 10 nm. According to certain embodiments, the length of each of the plurality of nanostructures is selected independently of the length of other nanostructures in the plurality of nanostructures, such that the plurality of nanostructures comprises a distribution of lengths. The distribution of lengths can be random or ordered.

Each of the one or more of the plurality of nanostructures can have a height within a range having a lower limit and/or an upper limit. The range can include or exclude the lower limit and/or the upper limit. The lower limit and/or upper limit can be selected from 1, 2, 3, 4, 5, 6, 7, 8, 9, 10, 15, 20, 25, 30, 35, 40, 45, 50, 55, 60, 65, 70, 75, 80, 85, 90, 95, 100, 105, 110, 115, 120, 125, 130, 135, 140, 145, 150, 155, 160, 165, 170, 175, 180, 185, 190, 195 and 200 nm. For example, according to certain preferred embodiments, the one or more of the plurality of nanostructures can have a height of less than or equal to 150 nm, of less than 100 nm, or of from 5 to 10 nm. According to certain embodiments, the height of each of the plurality of nanostructures is selected independently of the height of other nanostructures in the plurality of nanostructures, such that the plurality of nanostructures comprises a distribution of heights. The distribution of heights can be random or ordered.

The plurality of nanostructures can define a plurality of nanopores. As used herein, the term "nanopores" refers to pores with a major diameter ranging from 1 to 750 nm. Nanopores can also refer to pores having a major diameter ranging from 5 to 500 nm, or 10 to 400 nm, or any combination thereof, e.g., 400 to 750 nm.

Deposition Methods

The film can be formed on a substrate. According to certain embodiments, the film can be atomically-bonded to the substrate. According to other embodiments, the film can be formed on a substrate, and the substrate can be selected from the group consisting of a glass, a metal-oxide, a metal-oxynitride, a metal, and combinations thereof. In other embodiments, the film can be formed on a substrate, and the substrate can include a plurality of components selected from the group consisting of a glass, a metal-oxide, a metal-oxynitride, a metal, and combinations thereof, and the plurality of components can be arranged in a stacked configuration.

The depositing step can employ a deposition method selected from the group consisting of RF or DC magnetron sputtering, metal organic chemical vapor deposition (MOCVD), chemical vapor deposition (CVD), pulsed-laser deposition, e-beam evaporation, sol-gel processing, aerosol/spray pyrolysis, atomic layer deposition (ALD), metal organic deposition, and combinations thereof.

The depositing step can employ a deposition method, and the deposition method can be RF magnetron sputtering. The RF magnetron sputtering can include sputtering onto a biaxially textured metal template. The RF magnetron sputtering can include sputtering onto a biaxially textured metal template, and the biaxially textured metal template can include Cu or Ni or alloys of Ni or Cu or Ag. The RF magnetron sputtering can include sputtering onto a single crystal substrate. The RF magnetron sputtering can include sputtering onto a single crystal substrate, and the single crystal substrate can include one selected from the group consisting of Si, Ge, GaAs, InP, GaN, $SrTiO_3$, $LaAlO_3$, Yttria stabilized zirconia (YSZ), MgO, $Al_2O_3$ and combinations thereof. The RF magnetron sputtering employs a sputter target, and the sputter targets can be prepared from a mixture. According to one embodiment, the mixture can include $TiO_2$ (anatase) and $Cu_2O$ powders packed into 2 inch diameter copper trays.

The mixture can include an amount of the first component within a range having a lower limit and/or an upper limit. The range can include or exclude the lower limit and/or the upper limit. The lower limit and/or upper limit can be selected from 5, 10, 15, 20, 25, 30, 35, 40, 45, 50, 55, 60, 65, 70, 75, 80, 85, 90, and 95 wt. %. For example, according to certain preferred embodiments, the mixture can include an amount of the first component powder of from 10 to 90 wt. %, or about 50 wt. %. The mixture can also include an amount of the second component within a range having a lower limit and/or an upper limit. The range can include or exclude the lower limit and/or the upper limit. The lower limit and/or upper limit can be selected from 5, 10, 15, 20, 25, 30, 35, 40, 45, 50, 55, 60, 65, 70, 75, 80, 85, 90, and 95 wt. %. For example, according to certain preferred embodiments, the mixture can include an amount of the second component powder of from 90 to 10 wt. %, or about 50 wt. %, based on the total weight of the mixture.

The first component and the second component can take a variety of forms. For example, the components can be hard-pressed ceramic sputtering targets or powders. For chemical solution processing methods, such as sol-gel or metal organic decomposition, the components can be a mixture of phase components in aqueous form, i.e., liquid precursor form. Similarly, for chemical vapor deposition processes, the components can be in liquid precursor forms. According to various embodiments the components of oxides can be dissolved in chemical solutions, hence when they dissolve they are in liquid form.

According to one embodiment, the mixture can include an amount of $TiO_2$ powder within a range having a lower limit and/or an upper limit. The range can include or exclude the lower limit and/or the upper limit. The lower limit and/or upper limit can be selected from 5, 10, 15, 20, 25, 30, 35, 40, 45, 50, 55, 60, 65, 70, 75, 80, 85, 90, and 95 wt. %. For example, according to certain preferred embodiments, the mixture can include an amount of $TiO_2$ powder of from 10 to 90 wt. %, or about 50 wt. %. The mixture can also include an amount of $Cu_2O$ powder within a range having a lower limit and/or an upper limit. The range can include or exclude the lower limit and/or the upper limit. The lower limit and/or upper limit can be selected from 5, 10, 15, 20, 25, 30, 35, 40, 45, 50, 55, 60, 65, 70, 75, 80, 85, 90, and 95 wt. %. For example, according to certain preferred embodiments, the mixture can include an amount of $Cu_2O$ powder of from 90 to 10 wt. %, or about 50 wt. %, based on the total weight of the mixture.

Deposition Conditions

The depositing step can be conducted at a temperature within a range having a lower limit and/or an upper limit. The range can include or exclude the lower limit and/or the upper limit. The lower limit and/or upper limit can be selected from 5, 10, 15, 20, 25, 30, 35, 40, 45, 50, 75, 100, 125, 150, 175, 200, 225, 250, 275, 300, 325, 350, 375, 400, 425, 450, 475, 500, 525, 550, 575, 600, 625, 650, 675, 700, 725, 750, 775, 800, 825, 850, 875, and 900 degrees Celsius. For example, according to certain preferred embodiments, the depositing step can be conducted at a temperature of from 10 to 800 degrees Celsius, to ensure that the first component and the second component remain insoluble and phase-separated during the depositing step.

The depositing step can be conducted at a pressure within a range having a lower limit and/or an upper limit. The range can include or exclude the lower limit and/or the upper limit. The lower limit and/or upper limit can be selected from 0.1, 0.2, 0.3, 0.4, 0.5, 1, 2, 3, 4, 5, 6, 7, 8, 9, 10, 11, 12, 13, 14, 15, 16, 17, 18, 19, 20, 21, 22, 23, 24, 25, 26, 27, 28, 29, and 30 mTorr. For example, according to certain preferred embodiments, the depositing step can be conducted at a pressure of from 0.5 mTorr to 30 mTorr.

Product-by-Process

Various embodiments relate to a superhydrophobic film prepared by the methods described above. For example, a superhydrophobic film can be prepared by a method including depositing a first component and a second component to form a film including a plurality of nanostructures, the first component and the second component can be immiscible and phase-separated during the depositing step, and coating the nanostructures with a hydrophobic layer to render the film superhydrophobic.

Films

Various embodiments relate to films including a plurality of nanostructures coated with a hydrophobic layer. Various properties can be helpful to describe the nature of the film, including but not limited to the thickness of the film, the average surface roughness (Ra) of the film, the surface area of the film, a contact angle between the film and a drop of water, a roll off angle of a drop of water deposited on the film, and a degree of hydrophobicity degradation of the film.

FIG. 1 shows a schematic illustration of a superhydrophobic structure 100, comprising a superhydrophobic composite film 101 deposited onto a substrate 102. The superhydrophobic composite film can comprise a metal oxide (MO), a metal nitride (MN), a metal oxynitride (MON), and/or a metal (Me). For example, the superhydrophobic composite can comprise a $TiO_2:Cu_2O/SrTiO_3$ [(MO:MO)/(MO)] or $TiO_2:Cu_2O/Cu$[(MO:MO)/(ME)] structure. The superhydrophobic composite film can have irregular, circular, rectangular, hexagonal or polyhedral structural features in the nano-scale. The substrate 102 can comprise a glass, a metal-oxide, a metal-oxynitride, a nitride, a metal, and combinations thereof.

The film can have a thickness within a range having a lower limit and/or an upper limit. The range can include or exclude the lower limit and/or the upper limit. The lower limit and/or upper limit can be selected from 1, 2, 3, 4, 5, 6, 7, 8, 9, 10, 15, 20, 25, 30, 35, 40, 45, 50, 55, 60, 65, 70, 75, 80, 85, 90, 95, 100, 200, 300, 400, 500, 600, 700, 800, 900, 1000, 1100, 1200, 1300, 1400, and 1500 nm. For example, according to certain preferred embodiments, the film can have a thickness greater than or equal to 5 nm, from 5 to 1,000 nm, or from 25 to 50 nm.

The film can have an average surface roughness (Ra), as measured on a 5 μm×5 μm area, within a range having a lower limit and/or an upper limit. The range can include or exclude the lower limit and/or the upper limit. The lower limit and/or upper limit can be selected from 50, 55, 60, 65, 70, 75, 80, 85, 90, 95, 100, 105, 110, 115, 120, 125, 130, 135, 140, 145, 150, 155, 160, 165, 170, 175, 180, 185, 190, 195, 200, 205, 210, 215, 220, 225, 230, 235, 240, 245, and 250 nm. For example, according to certain preferred embodiments, the film can have an average surface roughness (Ra) of from 90 to 120 nm, or of about 104, nm, as measured on a 5 μm×5 μm area.

The film can have an average surface roughness (Ra), as measured on a 10 μm×10 μm area, within a range having a lower limit and/or an upper limit. The range can include or exclude the lower limit and/or the upper limit. The lower limit and/or upper limit can be selected from 5, 10, 15, 20, 25, 50, 75, 100, 125, 150, 175, 200, 225, 250, 275, 300, 325, 350, 375, 400, 425, 450, 475, 500, 600, 700, 800, 900, and 1000 nm. For example, according to certain preferred embodiments, the film can have an average surface roughness (Ra) of from 20 to 500 nm, as measured on a 10 μm×10 μm area.

The film can have a surface area within a range having a lower limit and/or an upper limit. The range can include or exclude the lower limit and/or the upper limit. The lower limit and/or upper limit can be selected from 5, 10, 15, 20, 25, 30, 35, 40, 45, 50, 55, 60, 65, 70, 75, 80, 85, 90, 95, 100, 110, 120, 130, 140, 150, 160, 170, 180, 190, 200, 225, 250, 275, 300, 325, 350, 375, and 400 m²/g. For example, according to certain preferred embodiments, the film can have a surface area of at least 20 m²/g of film, of at least 30 m²/g of film, of at least 50 m²/g of film, or of from 20 to 300 m²/g of film.

When exposed to a temperature, within a range to be defined below, the film can maintain a contact angle within a range having a lower limit and/or an upper limit. The range can include or exclude the lower limit and/or the upper limit. The lower limit and/or upper limit can be selected from 120, 125, 130, 135, 140, 145, 150, 151, 152, 153, 154, 155, 156, 157, 158, 159, 160, 161, 162, 163, 164, 165, 166, 167, 168, 169, 170, 171, 172, 173, 174, 175, 176, 177, 178, and 179 degrees. The above-mentioned temperature can be within a range having a lower limit and/or an upper limit. The range can include or exclude the lower limit and/or the upper limit. The lower limit and/or upper limit can be selected from −100, −90, −80, −70, −60, −50, −40, −30, −20, −10, 0, 10, 20, 30, 40, 50, 60, 70, 80, 90, 100, 150, 200, 250, 300, 350, 400, 450, 500, 550, 600, 650, 700, 750, 800, 850, 900, 950, and 1000 degrees Celsius. For example, according to certain preferred embodiments, the temperature in a range of from −40 degrees Celsius to 800 degrees Celsius. For example, according to certain preferred embodiments, the film can maintain a contact angle of at least 150 degrees with a drop of water when exposed to a temperature in a range of from −40 degrees Celsius to 800 degrees C.

When exposed to ultraviolet radiation having a wavelength, within a range to be defined below, the film can have a degree of hydrophobicity degradation within a range having a lower limit and/or an upper limit. The range can include or exclude the lower limit and/or the upper limit. The lower limit and/or upper limit can be selected from an undetectable limit, 0, 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, and 5%. For example, according to certain preferred embodiments, when exposed to ultraviolet radiation having a wavelength, within a range to be defined below, the film can have no detectable hydrophobicity degradation. The above-mentioned ultraviolet radiation can have a wavelength within a range having a lower limit and/or an upper limit. The range can include or exclude the lower limit and/or the upper limit. The lower limit and/or upper limit can be selected from 25, 50, 75, 100, 125, 150, 175, 200, 225, 250, 275, 300, 325, 350, 375, 400, 425, 450, 475, and 500 nm. For example, according to certain preferred embodiments, the film can have no detectable hydrophobicity degradation, or less than 0.1% hydrophobicity degradation when exposed to ultraviolet radiation having a wavelength of from 100 to 400 nm. As used herein, the term "hydrophobicity degradation" means a lessening in a contact angle between the film and a drop of water disposed upon the film.

The film can have a contact angle with a drop of water within a range having a lower limit and/or an upper limit. The range can include or exclude the lower limit and/or the upper limit. The lower limit and/or upper limit can be selected from 100, 105, 110, 115, 120, 125, 130, 135, 140, 145, 150, 155, 160, 165, 170, 171, 172, 173, 174, 175, 176, 177, 178, and 179 degrees. For example, according to certain preferred embodiments, the film can have a contact angle with a drop of water of at least 120 degrees, of about 175 degrees, or of at least 170 degrees.

The film can have a roll off angle within a range having a lower limit and/or an upper limit. The range can include or exclude the lower limit and/or the upper limit. The lower limit and/or upper limit can be selected from 0.1, 0.2, 0.3, 0.4, 0.5, 0.6, 0.7, 0.8, 0.9, 1, 2, 3, 4, 5, 10, 15, 20, 25, 30, 35, 40, 45, and 50 degrees. For example, according to certain preferred embodiments, the film can have a roll off angle of less than 30 degrees, or of about 0.5 degrees.

As stated above, the films according to certain embodiments include a plurality of nanostructures. The one or more of the plurality of nanostructures can include a plurality of disordered structural features. At least one of the structural features can be selected from the group consisting of an irregular feature, a circular feature, a rectangular feature, a hexagonal feature, a polyhedral feature, and combinations thereof. Each of the one or more of the plurality of nanostructures can have a width within a range having a lower limit and/or an upper limit. The range can include or exclude the lower limit and/or the upper limit. The lower limit and/or upper limit can be selected from 1, 2, 3, 4, 5, 6, 7, 8, 9, 10, 15, 20, 25, 30, 35, 40, 45, 50, 55, 60, 65, 70, 75, 80, 85, 90, 95, 100, 105, 110, 115, 120, 125, 130, 135, 140, 145, 150, 155, 160, 165, 170, 175, 180, 185, 190, 195 and 200 nm. For example, according to certain preferred embodiments, the one or more of the plurality of nanostructures can have a width of less than or equal to 150 nm, of less than 100 nm, or of from 5 to 10 nm. According to certain embodiments, the width of each of the plurality of nanostructures is selected independently from the width of other nanostructures in the plurality of nanostructures, such that the plurality of nanostructures comprises a distribution of widths. The distribution of widths can be random or ordered.

As stated above, the films according to certain embodiments include a plurality of nanostructures coated with a hydrophobic layer. The hydrophobic layer can include a hydrophobic self-assembled-monolayer (SAM). The hydrophobic layer can include at least one selected from the group consisting of a fluorocarbon, a perfluorocarbon, a polyfluorocarbon, an aliphatic compound, a methylated compound, and combinations thereof. The hydrophobic layer can include a hydrophobic fatty acid. The hydrophobic layer can include a hydrophobic fatty acid selected from the group consisting of propanoic acid, butanoic acid, pentanoic acid, hexanoic acid, heptanoic acid, octanoic acid, nonanoic acid, decanoic acid, undecanoic acid, dodecanoic acid, tridecanoic acid, tridecanoic acid, tetradecanoic acid, pentadecanoic acid, hexadecanoic acid, heptadecanoic acid, octadecanoic acid, nonadecanoic acid, eicosanoic acid, heneicosanoic acid, docosanoic acid, tricosanoic acid, tetracosanoic acid, pentacosanoic acid, hexacosanoic acid, heptacosanoic acid, octacosanoic acid, nonacosanoic acid, triacontanoic acid, henatriacontanoic acid, dotriacontanoic acid, tritriacontanoic acid, tetratriacontanoic acid, pentatriacontanoic acid, hexatriacontanoic acid, and combinations thereof.

Another embodiment relates to an article including a substrate and at least one layer comprising a film according to any of the preceding embodiments. The at least one layer can be adhered to the substrate. The article can be optically transparent. The article can include a plurality of layers. Each layer can include or can be a film according to any of the preceding embodiments. The substrate can be any material, including, but not limited to, glass, metal, metal-oxide, nitride materials, wood, wax, polymer, mixed metal oxides, graphene, and plastic materials. The plastic material can be any plastic material. A preferred plastic material is polycarbonate.

EXAMPLES

The following examples are provided to demonstrate creation of thin films consisting of a chemically phase-segregated composite nanostructures onto single crystal as well as on metal templates. The results demonstrate the superior superhydrophobic quality of the phase-separated nanostructured composite films.

Example 1

This example demonstrates the creation of thin films comprising a chemically phase-segregated $TiO_2$ and $Cu_2O$ composite nanostructures using RF magnetron sputtering onto single crystal substrates (e.g., $SrTiO_3$ and $LaAlO_3$). The sputter targets were prepared from a mixture of 50 mol % $TiO_2$ (anatase) and 50 mol % $Cu_2O$ powders, which were packed into 2 inch diameter copper trays. To generate a superhydrophobic surface, the phase separated nanostructured film is coated with a chemically hydrophobic self-assembled-monolayer (SAM) such as a fluorocarbon or hydrophobic fatty acid. The specific hydrophobic layer employed was a 1,1,2,2-Tetrahydroperfluorooctyl)trichlorosilane).

Figure 2:
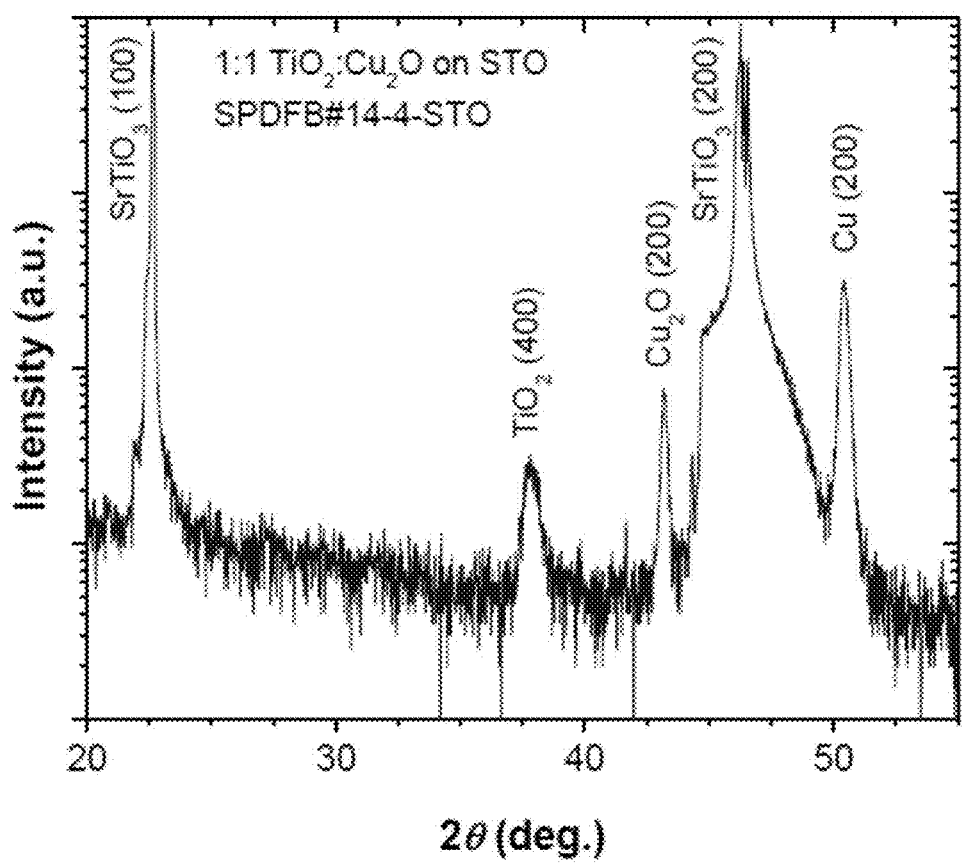
FIG. 2 shows an XRD pattern of a $TiO_2$—$Cu_2O$ composite film deposited on $SrTiO_3$ (001) substrate, revealing phase separation of $TiO_2$ and $Cu_2O$ phases.

FIG. 2 shows an X-ray Diffraction (XRD) pattern of a $TiO_2$—$Cu_2O$ composite film deposited on $SrTiO_3$ (001) substrate, revealing phase separation of $TiO_2$ and $Cu_2O$ phases. It is also evident that the conditions employed during the sputter deposition are favorable for partial reduction of $Cu_2O$ to metallic Cu phase.

FIG. 3(a) is an image showing the profile of a water droplet 301 (~4 μl) eluted from a syringe 302 onto the surface of a superhydrophobic $TiO_2$:$Cu_2O$ composite thin film coating 303 on $SrTiO_3$ substrate 304 with a static contact angle of 170° and a roll-off angle <0.5°.

FIG. 3(b) shows a plan-view scanning electron microscopy image of the same film 303 shown in FIG. 3(a), displaying nanostructural features (100 nm size) on the surface with a coral-like appearance.

FIG. 3(c) is a photograph showing a wafer 307 comprising the same superhydrophobic transparent coating 303 on the same substrate 304, as shown in FIG. 3(a) and FIG. 3(b). The wafer 307 is shown floating in blue-colored water 306 in a dish 305. Because of the superhydrohobic properties imparted to the wafer 307 by the superhydrophobic transparent coating 303, the wafer is shown demonstrating the "Moses effect", where the water (blue colored) is repelled from the wafer 307 in a region 308 surrounding the wafer 307.

Figure 4A:
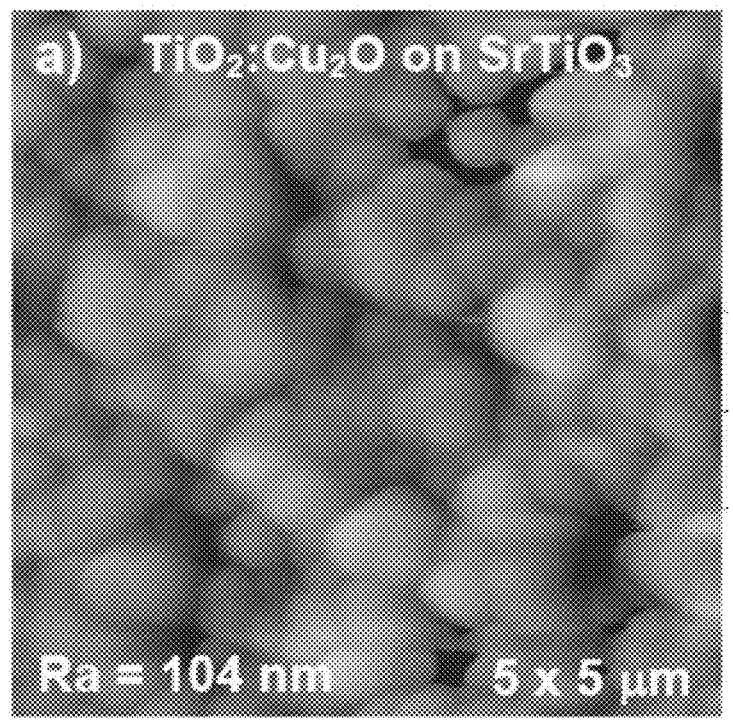
FIG. 4(a) shows a top view of an Atomic Force Microscopy (AFM) image showing the surface microstructure of sputter deposited $TiO_2$:$Cu_2O$ composite film on $SrTiO_3$ substrates.

FIG. 4(a) shows a top view of an Atomic Force Microscopy (AFM) image showing the surface microstructure of sputter deposited $TiO_2$:$Cu_2O$ composite film on $SrTiO_3$ substrates.

Figure 4B:
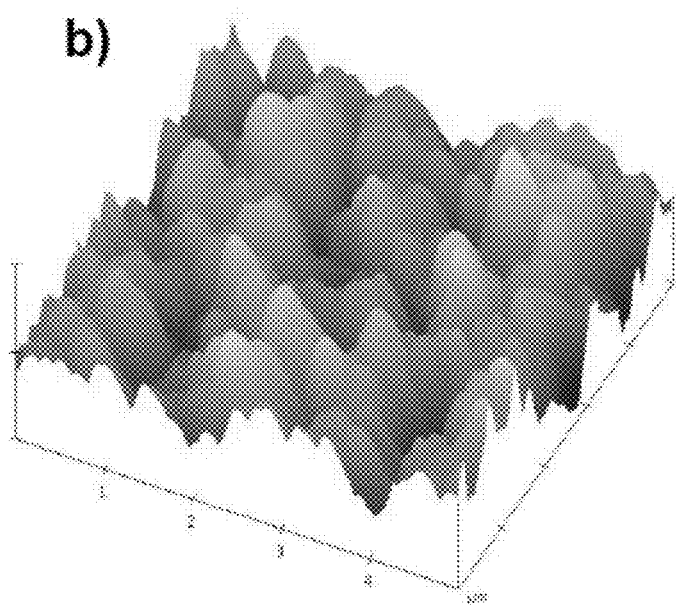
FIG. 4(b) shows 3D surface plot representation of the same film shown in FIG. 4(a), having an average surface roughness (Ra) of the film measured on a 5 µm×5 µm area of about 104 nm.

FIG. 4(b) shows 3D surface plot representation of the same film shown in FIG. 4(a), having an average surface roughness (Ra) of the film measured on a 5 μm×5 μm area of about 104 nm.

Figures 5A, 5B:
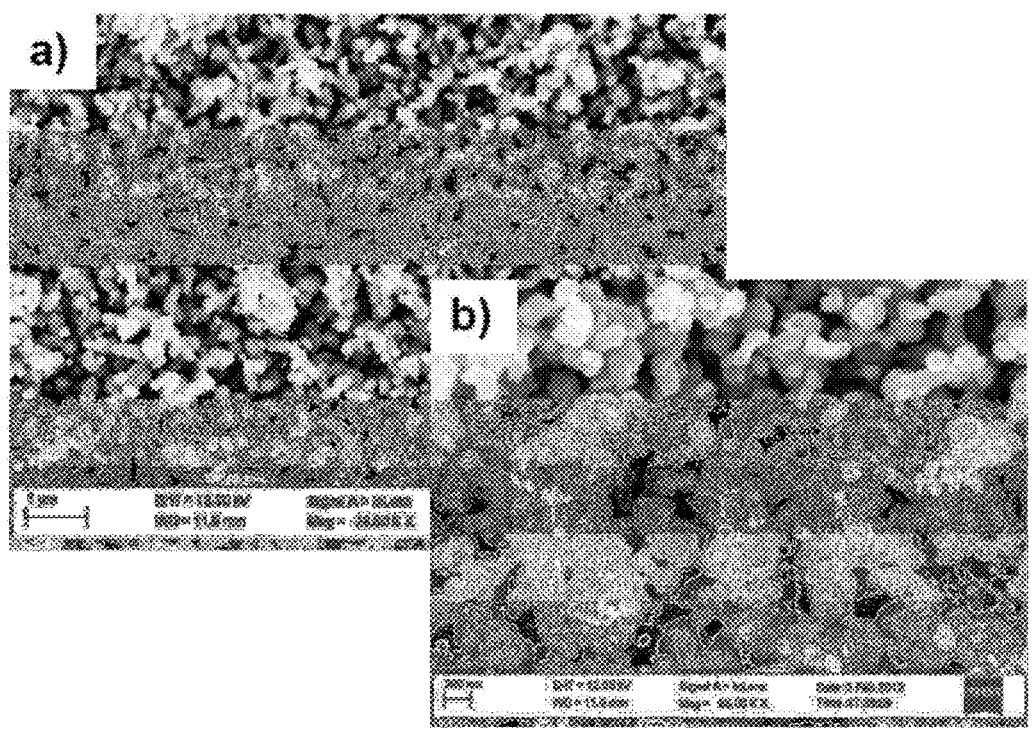
FIG. 5(a) shows a scanning electron microscopy image at low-magnification of a phase-separated, nanostructured superhydrophobic $TiO_2$:$Cu_2O$ composite thin film surface.
FIG. 5(b) shows a high-magnification scanning electron microscopy image, of the same phase-separated, nanostructured superhydrophobic $TiO_2$:$Cu_2O$ composite thin film surface shown in FIG. 5(a)
Figures 6A, 6B, 6C, 6D, 6E, 6F, 6G, 6H, 6I, 6J:
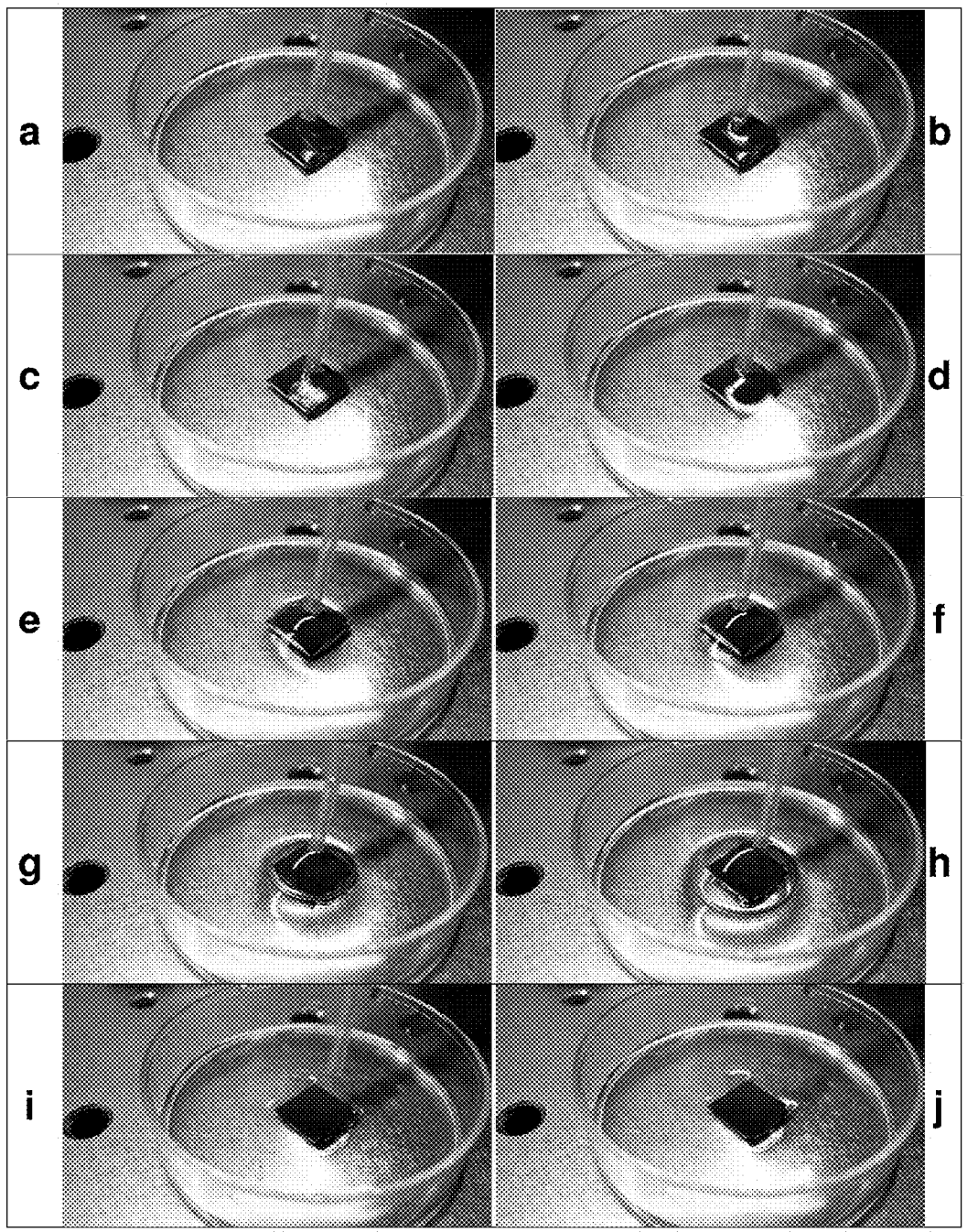
FIG. 6a-6j show frames from a video demonstrating the superhydrophobic characteristics of the film shown in FIG. 3(c)
Figures 7A, 7B, 7C, 7D, 7E, 7F, 7G, 7H, 7I, 7J:
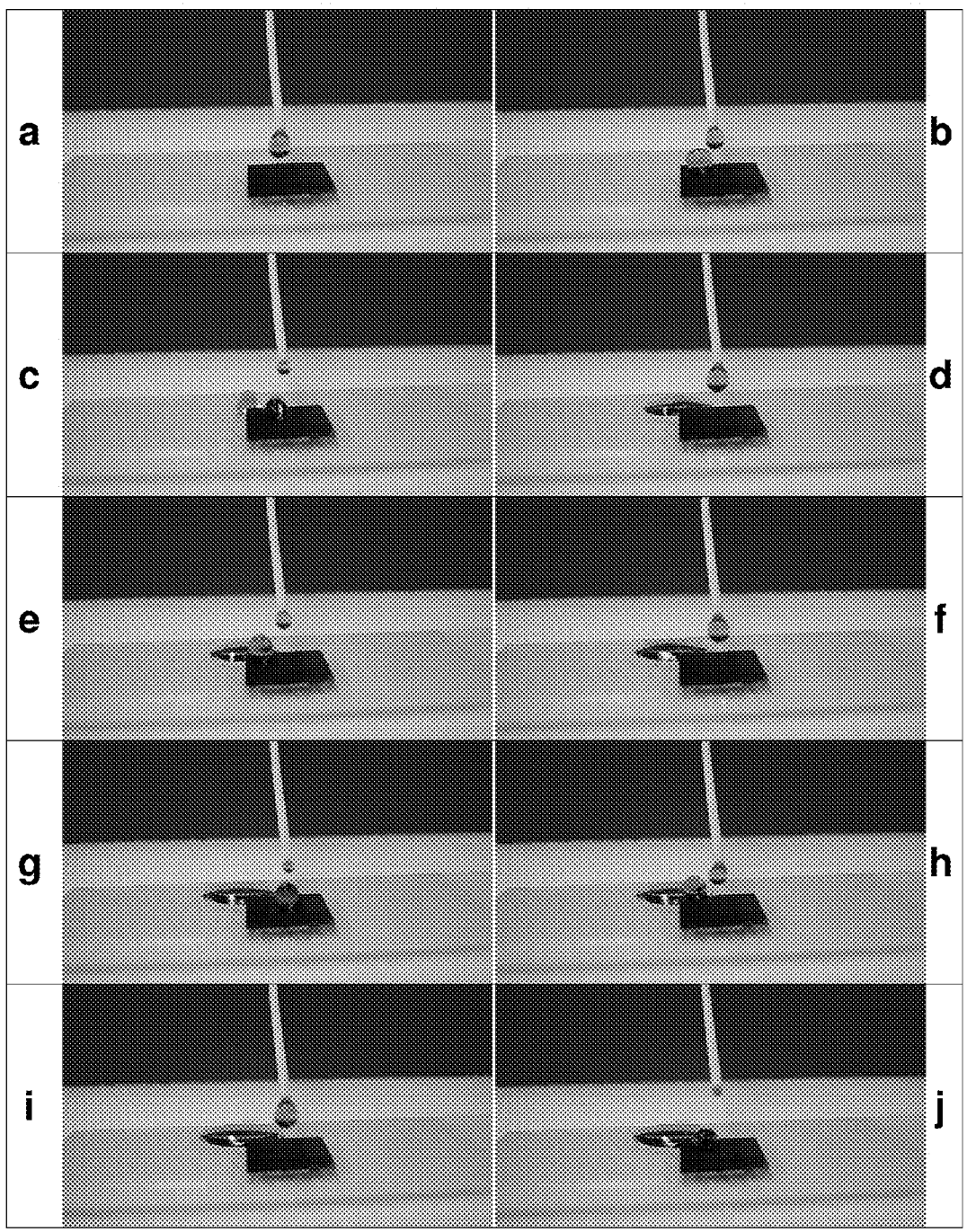
FIG. 7a-7j show frames from a video demonstrating the superhydrophobic characteristics of the film shown in FIG. 3(c)

FIG. 5(a) shows a scanning electron microscopy image at low-magnification of a phase-separated, nanostructured superhydrophobic $TiO_2$:$Cu_2O$ composite thin film surface.

FIG. 5(b) shows a high-magnification scanning electron microscopy image, of the same phase-separated, nanostructured superhydrophobic $TiO_2$:$Cu_2O$ composite thin film surface shown in FIG. 5(a).

FIGS. 6a-6j show frames from a video demonstrating the superhydrophobic characteristics of the film shown in FIG. 3(c).

FIGS. 7a-7j show frames from a video demonstrating the superhydrophobic characteristics of the film shown in FIG. 3(c).

Example 2

This example demonstrates the creation of thin films comprising a chemically phase-segregated $TiO_2$ and $Cu_2O$ composite nanostructures using RF magnetron sputtering onto biaxially textured metal templates (e.g., Cu). To generate a superhydrophobic surface, the phase separated nanostructured film is coated with a chemically hydrophobic self-assembled-monolayer (SAM) such as a fluorocarbon or hydrophobic fatty acid. The specific hydrophobic layer used comprised tridecafluoro-1,1,2,2-tetrahydroctyltriclorosilane. 1 volume % of tridecafluoro-1,1,2,2-tetrahydroctyltriclorosilane was mixed with hexane and the sample was dipped in the solution for 15 minutes, then heat treated (baked in a furnace) for 15 minutes.

As shown in FIG. 5(a) and FIG. 5(b), compared to single crystal substrate surface morphology, presented in FIG. 2b, similar surface features are can be established on metal templates according to various embodiments of the invention. Superhydrophobic properties of the composite films on Cu templates are also comparable to those obtained on single crystal substrates.

Example 3

A layer of air can be pinned between the films according to various embodiments of the invention and water disposed on the films. As used herein, the term "pinned" refers to being held in place by surface tension forces, van der Waal forces (e.g., suction), or combinations of both. For example, the interactions that prevent a liquid from being dispensed from a laboratory pipette until the plunger is depressed could be referred to as pinning.

According, such a superhydrophobic phase separated thin film was sputtered onto an aluminum plate and submerged in water. The result was a layer of pinned air on the coating's surface.

Figure 8:
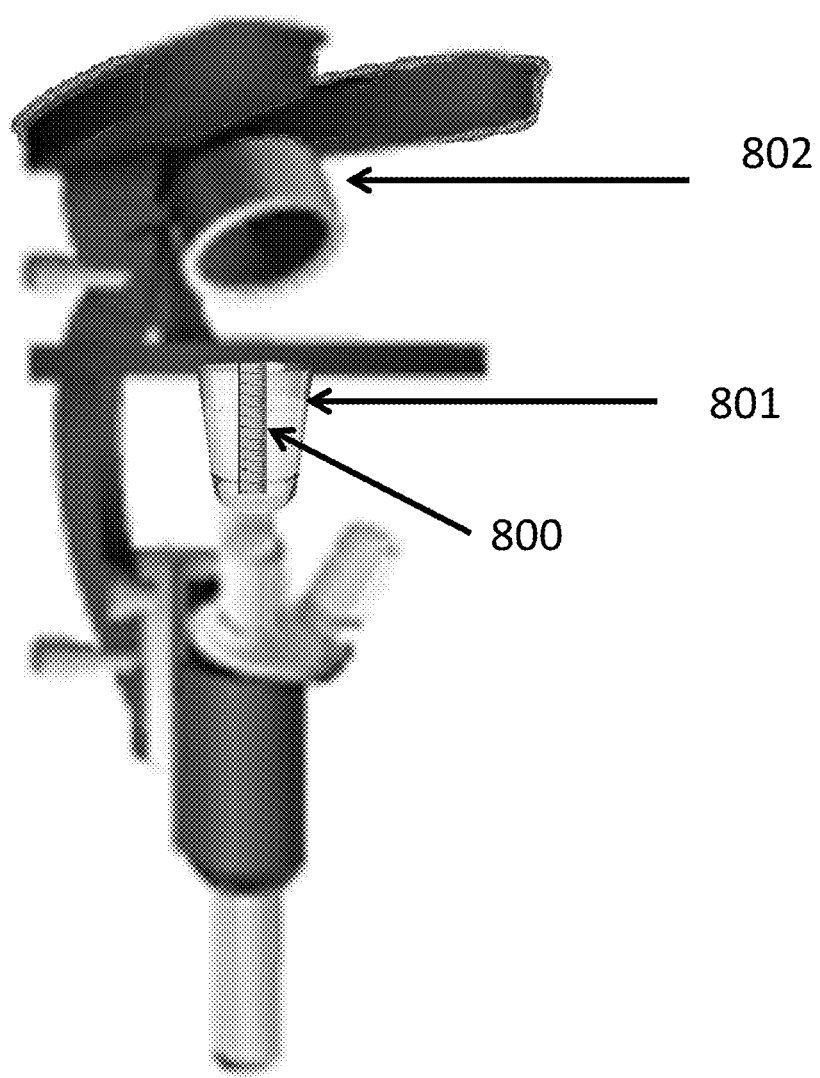
FIG. 8 shows an optical microscope set up to measure air pinned between water and a superhydrophobic film according to one embodiment.

Referring to FIG. 8, to measure the amount of pinned air, a coated aluminum plate 800 coated with superhydrophobic material was dipped into a glass of water 801 at room temperature. The thickness of the pinned air layer was measured using a micrometer under an inverted microscope 802. The pinned air layer was easily identified, under the optical microscope 802, as a layer with a different contrast due to changes in the refractive index of the materials. The air layer thickness ranged from 10 microns to 15 microns. In general, the air layer thickness will depend on the specific topology of the coatings and the superhydrophobic quality of the bonded particles.

According to various embodiments, the air layer thicknesses can have a thickness within a range having a lower limit and/or an upper limit. The range can include or exclude the lower limit and/or the upper limit. The lower limit and/or upper limit can be selected from 5, 6, 7, 8, 9, 10, 11, 12, 13, 14, 15, 16, 17, 18, 19, 20, 21, 22, 23, 24, 25, 26, 27, 28, 29 and 30 microns at one atmosphere pressure. For example, according to certain preferred embodiments, according to various embodiments, the air layer thicknesses can have a thickness of from 5 microns to 30 microns at one atmosphere pressure. With increased pressure the thickness could be reduced to below 1 micron.

Although the present invention has been described in considerable detail with reference to certain preferred versions thereof, other versions are possible. Therefore, the spirit and scope of the appended claims should not be limited to the description of the preferred versions contained herein.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C §112, sixth paragraph. In particular, the use of "step of" in the claims herein is not intended to invoke the provisions of 35 U.S.C §112, sixth paragraph.

What is claimed is:

1. A method of making a superhydrophobic film on a substrate comprising:
    depositing a first component in a first phase and a second component in a second phase onto the substrate, the first phase being immiscible with the second phase such that a film is formed comprising a plurality of nanostructures of the first phase and nanostructures of the second phase, wherein during the depositing step the substrate is maintained at a temperature of from 400 to 900 degrees C., and the first component and the second component do not react with each other and remain insoluble and phase-separated during and after the depositing step;
    wherein the nanostructures of the first phase are lattice mismatched with the nanostructures of the second phase, such that the nanostructures of the first phase and the nanostructures of the second phase when deposited create a roughened surface;
    lowering the temperature of the deposited film of the nanostructures of the first component in the first phase and the second component in the second phase to below 400 degrees C.; and
    coating the nanostructures with a hydrophobic layer to render the film superhydrophobic.

2. The method of claim 1, wherein the first component and the second component are independently selected from the group consisting of a metal oxide, a metal nitride, a metal oxynitride, a metal, and combinations thereof.

3. The method of claim 2, wherein the metal oxide is selected from the group consisting of $Cu_xO_y$, ZnO, MgO, $SnO_2$, $(RE)MnO_3$, $Bi_2O_3$, $ZnMn_2O_4$, $Fe_2O_3$, $WO_3$, $Al_2O_3$, $Ti_xO_y$, $Ba_xNb_yO_z$, $Ba_xTa_yO_z$, $Ba_xAl_yO_z$, $CoFeO_3$, $CoTiO_3$, $BaTiO_3$, $(RE)_xTa_yO_z$, $(RE)_xNb_yO_z$, $(RE)AlO_3$, $(RE)_2BaTaO_6$, $(RE)_2BaNbO_6$ and combinations thereof, wherein x, y, and z are selected independently of each other and are integers from 1 to 7, and wherein (RE) represents a rare earth element selected from the group consisting of Sc, Y, La, Ce, Pr, Nd, Pm, Sm, Eu, Gd, Tb, Dy, Ho, Er, Tm, Yb, and Lu.

4. The method of claim 1, wherein the first component is $Ti_xO_y$ and the second component is $Cu_xO_y$, wherein x is from 1 to 10, and wherein y is from 1 to 10.

5. The method of claim 1, wherein the first component is $TiO_2$ and the second component is $Cu_2O$, and the nanostructures comprises a $TiO_2$ phase, a $Cu_2O$ phase and a Cu phase.

6. The method of claim 1, wherein the substrate comprises a crystalline material.

7. The method of claim 6, wherein the crystalline material is selected from the group consisting of Si, Ge, GaAs, InP, GaN, $SrTiO_3$, $LaAlO_3$, Yttria stabilized zirconia (YSZ), MgO, Sapphire ($Al_2O3$), biaxially textured Nickel, Copper, Silver, Nickel alloys, Copper alloys, Silver alloys and combinations thereof.

8. The method of claim 6, wherein the film is an epitaxial film.

9. The method of claim 8, wherein the epitaxial film comprises a plurality of grains, wherein each grain comprises one selected from the first component and the second component,
    wherein at least 50% of the plurality of grains have at least one crystalline orientation selected from the group (1,1,1), (1,0,1), (1,0,0), (0,1,0), and (0,0,1), and wherein the grains have a tilt angle of from 0.5 to 15 degrees.

10. The method of claim 1, wherein the hydrophobic layer comprises a hydrophobic self-assembled-monolayer (SAM).

11. The method of claim 1, wherein the hydrophobic layer comprises at least one selected from the group consisting of a fluorocarbon, a perfluorocarbon, a polyfluorocarbon, an aliphatic compound, a methylated compound, and combinations thereof.

12. The method of claim 1, wherein the film has a thickness greater than or equal to 5 nm.

13. The method of claim 1, wherein the film has an average surface roughness (Ra) of from 90 to 120 nm, as measured on a 5 μm×5 μm area.

14. The method of claim 1, wherein the film has an average surface roughness (Ra) of from 20 to 500 nm, as measured on a 10 μm×10 μm area.

15. The method of claim 1, wherein the film has a surface area of at least 20 m2/g of film.

16. The method of claim 1, wherein the film maintains a contact angle of at least 150 degrees with a drop of water when exposed to a temperature in a range of from −40 degrees C. to 800 degrees C.

17. The method of claim 1, wherein the film has no detectable hydrophobicity degradation when exposed to ultraviolet radiation having a wavelength of from 100 to 400 nm.

18. The method of claim 1, wherein the film has a contact angle with a drop of water of at least 120 degrees and a roll off angle of less than 30 degrees.

19. The method of claim 1, wherein the film has a contact angle with a drop of water of at least 170 degrees.

20. The method of claim 1, wherein one or more of the plurality of nanostructures comprises a plurality of disordered structural feature, wherein at least one of the structural features is selected from the group consisting of an irregular feature, a circular feature, a rectangular feature, a hexagonal feature, a polyhedral feature, and combinations thereof.

21. The method of claim 1, wherein one or more of the plurality of nanostructures has a width of less than or equal to 150 nm.

22. The method of claim 1, wherein the film is formed on a substrate.

23. The method of claim 1, wherein the film is formed on a substrate, and wherein the film is atomically-bonded to the substrate.

24. The method of claim 1, wherein the depositing step employs a deposition method selected from the group consisting of RF or DC magnetron sputtering, metal organic chemical vapor deposition (MOCVD), chemical vapor deposition (CVD), pulsed-laser deposition, e-beam evaporation, sol-gel processing, aerosol/spray pyrolysis, atomic layer deposition (ALD), metal organic deposition, and combinations thereof.

25. The method of claim 1, wherein the depositing step employs a deposition method, and wherein the deposition method is RF magnetron sputtering.

26. The method of claim 1, wherein the depositing step employs a deposition method, wherein the deposition method is RF magnetron sputtering, and wherein the RF magnetron sputtering comprises sputtering onto a single crystal substrate.

27. The method of claim 1, wherein the depositing step employs a deposition method, wherein the deposition method is RF magnetron sputtering, wherein the RF magnetron sputtering comprises sputtering onto a single crystal substrate, and wherein the single crystal substrate comprises one selected from the group consisting of Si, Ge, GaAs, InP, GaN, $SrTiO_3$, $LaAlO_3$, Yttria stabilized zirconia (YSZ), MgO, $Al_2O3$ and combinations thereof.

28. The method of claim 1, wherein the depositing step employs a deposition method, wherein the deposition method is RF magnetron sputtering, wherein the RF magnetron sputtering employs a sputter target, and wherein the sputter targets are prepared from a mixture $TiO_2$ (anatase) and $Cu_2O$ powders packed into 2 inch diameter copper trays.

29. The method of claim 28, wherein the mixture comprises
from 10 to 90 wt. % of $TiO_2$ and
from 90 to 10 wt. % $Cu_2O$ powder.

30. The method of claim 1, wherein the depositing step is conducted at a temperature of from 500 to 800 degrees C., to ensure that the first component and the second component remain insoluble and phase-separated during the depositing step.

31. The method of claim 1, wherein the depositing step is conducted at a pressure of from 0.5 mTorr to 30 mTorr.

* * * * *